(12) United States Patent
Yokoyama

(10) Patent No.: US 7,838,320 B2
(45) Date of Patent: Nov. 23, 2010

(54) SEMICONDUCTOR PHYSICAL QUANTITY SENSOR AND METHOD FOR MANUFACTURING THE SAME

(75) Inventor: Kenichi Yokoyama, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 12/382,874

(22) Filed: Mar. 26, 2009

(65) Prior Publication Data

US 2009/0243005 A1    Oct. 1, 2009

(30) Foreign Application Priority Data

Apr. 1, 2008    (JP)    ............................. 2008-095241

(51) Int. Cl.
*H01L 21/00*    (2006.01)

(52) U.S. Cl. .............................. 438/50; 438/51; 438/52

(58) Field of Classification Search .............. 438/50–52
See application file for complete search history.

(56) References Cited

U.S. PATENT DOCUMENTS

| | | | | |
|---|---|---|---|---|
| 5,427,975 | A * | 6/1995 | Sparks et al. | 438/52 |
| 5,616,523 | A * | 4/1997 | Benz et al. | 438/50 |
| 5,683,591 | A * | 11/1997 | Offenberg | 216/2 |
| 6,127,908 | A * | 10/2000 | Bozler et al. | 333/246 |
| 6,714,625 | B1 * | 3/2004 | Leedy | 378/122 |
| 6,877,383 | B2 * | 4/2005 | Horie et al. | 73/754 |
| 7,004,029 | B2 * | 2/2006 | Sakai | 73/514.32 |
| 7,067,344 | B1 * | 6/2006 | Oguchi | 438/53 |
| 7,505,245 | B2 * | 3/2009 | Yokoyama | 361/277 |
| 2001/0029060 | A1 | 10/2001 | Fukada et al. | |
| 2002/0014673 | A1 * | 2/2002 | Leedy | 257/419 |
| 2002/0028045 | A1 * | 3/2002 | Yoshimura et al. | 385/50 |
| 2002/0045297 | A1 * | 4/2002 | Leedy | 438/149 |
| 2003/0019299 | A1 * | 1/2003 | Horie et al. | 73/718 |
| 2003/0057513 | A1 * | 3/2003 | Leedy | 257/506 |
| 2003/0218182 | A1 * | 11/2003 | Leedy | 257/151 |
| 2003/0223535 | A1 * | 12/2003 | Leedy | 378/34 |
| 2003/0224263 | A1 * | 12/2003 | Matsuoka | 430/22 |
| 2004/0132303 | A1 * | 7/2004 | Leedy | 438/689 |
| 2004/0150068 | A1 * | 8/2004 | Leedy | 257/506 |
| 2004/0237652 | A1 * | 12/2004 | Sakai | 73/514.32 |
| 2005/0001275 | A1 * | 1/2005 | Sugiura et al. | 257/414 |
| 2005/0082626 | A1 * | 4/2005 | Leedy | 257/432 |
| 2005/0130351 | A1 * | 6/2005 | Leedy | 438/128 |
| 2005/0156265 | A1 * | 7/2005 | Leedy | 257/432 |

(Continued)

FOREIGN PATENT DOCUMENTS

JP    A-9-113534    5/1997

*Primary Examiner*—Laura M Menz
(74) *Attorney, Agent, or Firm*—Posz Law Group, PLC

(57) ABSTRACT

A method for manufacturing a semiconductor physical quantity sensor having a fixed portion, a movable portion and an output terminal includes: forming a metal layer on a semiconductor layer; forming a resist on the metal layer; forming an opening and a side etching hole in the resist; anisotropically etching the metal layer via the opening and the hole; anisotropically etching the semiconductor layer via the opening so that the fixed portion is formed in the semiconductor layer; and side etching the metal layer from the opening and the hole so that the output terminal is formed on a part of the fixed portion, and a metal member is formed on another part of the fixed portion in such a manner that the metal member is electrically separated from the output terminal.

7 Claims, 9 Drawing Sheets

U.S. PATENT DOCUMENTS

2006/0057758 A1* 3/2006 Yokoyama ................... 438/51
2006/0213268 A1* 9/2006 Asami et al. ............. 73/514.16
2009/0243005 A1* 10/2009 Yokoyama .................. 257/415
2009/0261430 A1* 10/2009 Suzuki et al. ............... 257/417

* cited by examiner

SEMICONDUCTOR PHYSICAL QUANTITY SENSOR AND METHOD FOR MANUFACTURING THE SAME

CROSS REFERENCE TO RELATED APPLICATION

This application is based on Japanese Patent Application No. 2008-95241 filed on Apr. 1, 2008, the disclosure of which is incorporated herein by reference.

FIELD OF THE INVENTION

The present invention relates to a semiconductor physical quantity sensor having an output terminal for electrically coupling with an external circuit and a method for manufacturing a semiconductor physical quantity sensor.

BACKGROUND OF THE INVENTION

A semiconductor physical quantity sensor having a detection electrode for detecting static capacitance is disclosed in JP-A-2000-31502 corresponding to US Patent Application Publication No. 2001/0029060. The sensor is made from a SOI wafer, and the electrode is made of single crystal silicon. Specifically, the sensor includes a beam structure having a movable electrode displaceable in accordance with acceleration. The displacement of the beam structure provides capacitance change of a capacitor formed by the movable electrode and a fixed electrode, which is fixed on a substrate. The sensor detects the acceleration based on the capacitance change so that the sensor is a capacitive acceleration sensor.

The fixed electrode in the sensor is provided by a fixed portion. The fixed portion includes a wiring, on which an output terminal is arranged. The output terminal is electrically coupled with an external circuit. The fixed portion is formed in a SOI layer, and the output terminal is made of aluminum or the like. Accordingly, the fixed portion in the SOI layer is formed with using a special photo lithography mask. The output terminal is formed with using another special photo lithography mask. Thus, it is necessary to perform two photo lithography processes for manufacturing the sensor. One is for the fixed portion and the other is for the output terminal.

Thus, the number of processes is increased. Further, since each photo lithography process includes multiple steps, the manufacturing man-hour of the sensor increases. Further, since the different photo lithography masks are used in two processes, it is necessary to align the mask in each process. Accordingly, if a position of each mask is deviated from an appropriate position, the output terminal may not be formed on a predetermined area on the wiring. Thus, a manufacturing yield of the sensor may be reduced.

Thus, it is required for the sensor to align the masks for the fixed portion and the output terminal with high accuracy.

SUMMARY OF THE INVENTION

In view of the above-described problem, it is an object of the present disclosure to provide a semiconductor physical quantity sensor having an output terminal for electrically coupling with an external circuit. It is another object of the present disclosure to provide a method for manufacturing a semiconductor physical quantity sensor having an output terminal for electrically coupling with an external circuit.

According to a first aspect of the present disclosure, a method for manufacturing a semiconductor physical quantity sensor having a fixed portion, a movable portion and a first output terminal, wherein the fixed portion includes a fixed electrode and a fixed wiring, the movable portion includes a movable electrode facing the fixed electrode, the first output terminal is disposed on the fixed wiring, and the sensor detects a physical quantity based on a capacitance between the movable electrode and the fixed electrode, the method includes: forming a metal layer on a semiconductor layer; forming a resist on the metal layer; patterning the resist to have a first opening for the fixed portion and to have a first side etching hole, wherein the first side etching hole is arranged in a region of the resist surrounded with the first opening of the resist; anisotropically etching the metal layer exposed via the first opening and the first side etching hole; anisotropically etching the semiconductor layer exposed via the first opening so that the fixed portion is formed in the semiconductor layer; and side etching the metal layer from the first opening and the first side etching hole as a starting point so that the output terminal is formed on a part of the fixed wiring, and a first metal member is formed on another part of the fixed wiring in such a manner that the first metal member is electrically separated from the first output terminal.

In the above method, the fixed portion and the output terminal are formed with using only one resist as a mask. Accordingly, there is no difficulty about positioning deviation of the mask. Thus, a manufacturing yield of the sensor is improved, and the sensor has high detection accuracy. Further, the manufacturing process is reduced, so that a manufacturing cost of the senor is reduced.

According to a second aspect of the present disclosure, a semiconductor physical quantity sensor includes: a semiconductor layer; a fixed portion including a fixed electrode and a fixed wiring, which are disposed in the semiconductor layer; a first output terminal disposed on a part of the fixed wiring and coupled with an external circuit; a movable portion including a movable electrode, which faces the fixed electrode; and a metal member disposed on another part of the fixed wiring. The sensor detects a physical quantity based on a capacitance between the movable electrode and the fixed electrode, and the metal member is electrically separated from the first output terminal.

In the above sensor, since the fixed portion and the output terminal are formed at the same time, a manufacturing cost of the senor is reduced.

According to a third aspect of the present disclosure, a method for manufacturing a semiconductor device having a pattern portion and a pad, wherein the pattern portion is disposed in a semiconductor layer, and the pad for coupling with an external circuit is disposed on the pattern portion, the method includes: forming a metal layer on the semiconductor layer; forming a rests on the metal layer; patterning the resist to have a opening for the pattern portion and to have a side etching hole, wherein the side etching hole is arranged in a region of the resist surrounded with the opening of the resist; anisotropically etching the metal layer exposed via the opening and the side etching hole; anisotropically etching the semiconductor layer exposed via the opening so that the pattern portion is formed in the semiconductor layer; and side etching the metal layer from the opening and the side etching hole as a starting point so that the pad is formed on a part of the pattern portion, and a metal member is formed on another part of the pattern portion in such a manner that the metal member is electrically separated from the pad.

In the above method, the pattern portion and the pad are formed with using only one resist as a mask. Accordingly, there is no difficulty about positioning deviation of the mask. Thus, a manufacturing yield of the device is improved, and the device has high positioning accuracy. Further, the manufacturing process is reduced, so that a manufacturing cost of the device is reduced.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

A semiconductor physical quantity sensor according to a first embodiment will be explained as follows. The sensor may be an acceleration sensor having a movable portion. The acceleration sensor is suitably used for controlling an air bag system, an ABS, a VSC and the like for a vehicle.

Figure 1:
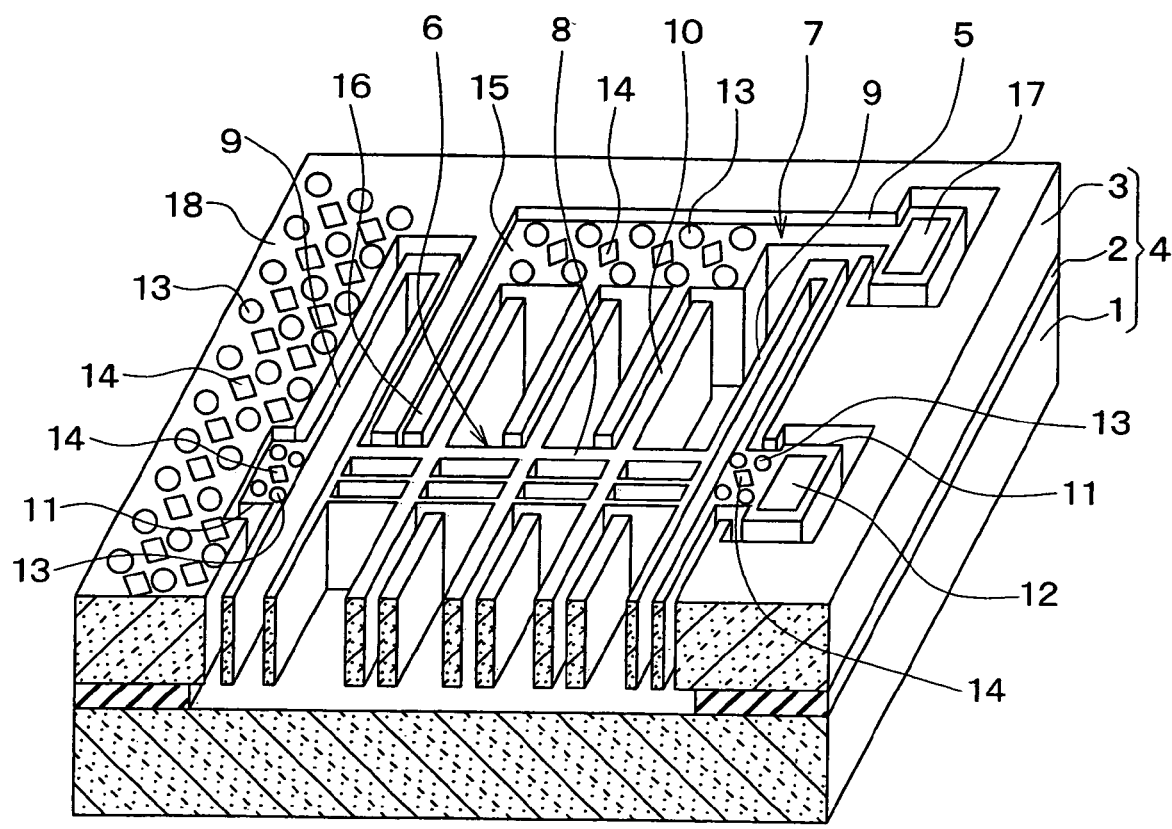
FIG. 1 is a diagram showing a perspective view of an acceleration sensor according to a first embodiment.

FIG. 1 shows the acceleration sensor. A sensing element in the sensor is formed from a SOI substrate 4, in which a support substrate 1, an embedded oxide film 2 and a silicon layer 3 are stacked in this order. The silicon layer 3 as a semiconductor layer is a SOI layer.

The substrate 1 is made of, for example, P conductive type silicon. The oxide film 2 provides a predetermined distance between the substrate 1 and the silicon layer 3. The oxide film 2 is partially removed. The silicon layer 3 is patterned so that a trench 5 is formed. Thus, a movable portion 6 as a beam structure and a fixed portion 7 are formed by using the trench 5. A part of the oxide film 2 is removed so that a part of the silicon layer 3 over the substrate 1 provides the movable portion 6. Another part of the oxide film 2 is not removed so that another part of the silicon layer 3 on the other part of the oxide film 2 provides the fixed portion 7.

As shown in FIG. 1, the movable portion 6 includes a weight portion 8 having an elongate shape, a spring 9, a movable electrode 10 and an anchor portion 11. Both ends of the spring 9 are connected to the weight portion 8. The movable electrode 10 is connected to the weight portion 8. The anchor portion 11 is integrated with the spring 9.

The weight portion 8 functions as a weight for displacing the movable portion 6 when acceleration is applied to the sensor.

The movable electrode 10 extends from one side of the elongate shape of the weight portion 8. In this embodiment, the sensor includes multiple movable electrodes 10 so that the movable electrodes 10 have a comb-teeth shape. A distance between two adjacent movable electrodes 10 is constant, and the width of each electrode 10 and a length of each electrode 10 are constant.

The spring 9 connects the weight portion 8 and the anchor portion 11. The spring 9 has a rectangular frame shape. Specifically, the spring includes two beams, which are in parallel to each other. One end of one beam is connected to one end of the other beam. The other end of the one beam is connected to the other end of the other beam. The spring 9 is displaceable along with a direction perpendicular to a longitudinal direction of the beams.

The anchor portion 11 supports one end of the spring 9 so that the spring 9 cantilevers. The embedded oxide film 2 under the anchor portion 11 exists so that the anchor portion 11 is fixed to the substrate 1 via the oxide film 2. Thus, the movable portion 6 is displaceable along with a horizontal direction of the substrate 1 according to the displacement of the spring 9, which is supported on the anchor portion 11.

An output terminal 12 for the movable portion 6 is formed on the surface of the anchor portion 11. A bonding wire (not shown) is electrically connected to the terminal 12 so that an electric potential of the movable portion 6 is retrieved. The terminal 12 is, for example, made of aluminum by a sputtering method, a vapor deposition method or the like.

Multiple holes 13 are formed on the surface of the anchor portion 11 so that the surface of the anchor 11 is concaved. A metal member 14 is arranged at an intersection of two diagonal lines among centers of four holes 13. Specifically, the metal member 14 is surrounded with four holes 13. The sensor includes multiple metal members 14. Each metal member 14 is electrically separated from the output terminal 12. The thickness of the metal member 14 is, for example, 1 μm. The diameter of the hole 13 is, for example, 2 μm.

The fixed portion 7 faces the long side of the weight portion 8. The fixed portion 7 includes a fixed wiring 15, a fixed electrode 16 and an output terminal 17 for the fixed portion 7.

The fixed wiring 15 electrically connects the fixed electrode 16 and the output terminal 17. The oxide film 2 under the fixed wiring 15 remains, i.e., is not removed, so that the fixed wiring 15 is fixed to the substrate 1.

The fixed electrode 16 extends along with a direction perpendicular to a side of the fixed wiring 15, which faces the movable portion 6. The sensor includes multiple fixed electrodes 16 so that the fixed electrodes 16 have a comb-teeth shape. A distance between two adjacent fixed electrodes 16 is constant, and the width and the length of each fixed electrode 16 are also constant. Each fixed electrode 16 faces a corresponding movable electrode 10 so that a capacitor is formed between the fixed electrode 16 and the movable electrode 10. When acceleration in the horizontal direction of the substrate 1 is applied to the sensor, the capacitance of the capacitor is changed, so that the acceleration is detected based on the capacitance change. The fixed electrode 16 is supported on the fixed wiring 15, so that the fixed electrode 16 is fixed to the substrate 1. Accordingly, the oxide film 2 under the fixed electrode 16 may be removed.

The output terminal 17 for the fixed portion 7 is a pad for electrically connecting the fixed electrode 16 to the external circuit via the fixed wiring 15. A bonding wire (not shown) is connected to the terminal 17, so that a certain electric potential may be applied to the fixed electrode 16 via the bonding wire.

The terminal 17 is formed from aluminum by a sputtering method, a vapor deposition method or the like. The terminal 17 has a square shape having four sides. The length of each side of the terminal 17 is, for example, 120 µm.

Figure 2:
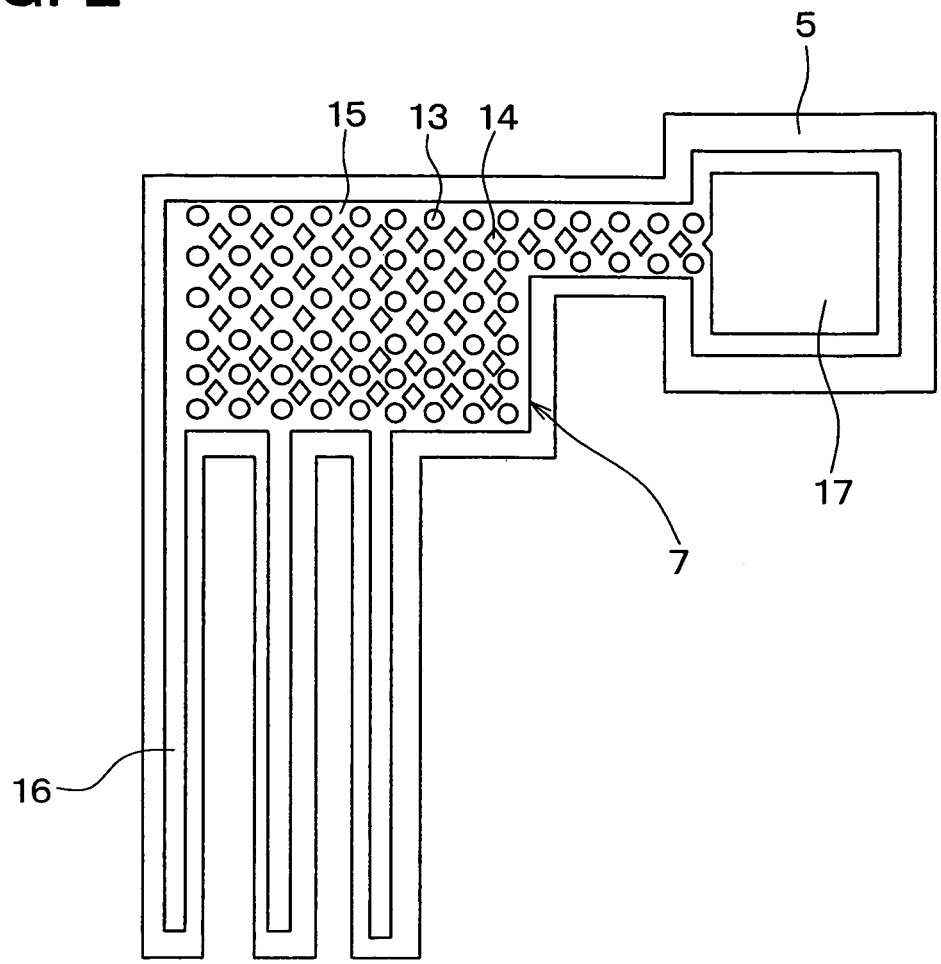
FIG. 2 is a diagram showing a plan view of a fixed portion of the sensor.

FIG. 2 shows a plan view of the fixed portion 7. Multiple holes 13 are formed on the surface of the fixed wiring 15 so that the surface of the fixed wiring 15 is concaved. Multiple metal members 14 are formed on the surface of the fixed wiring 15. Each metal member 14 is arranged at an intersection position surrounded with four holes 13. Each metal member 14 is electrically separated from the output terminal 17. The thickness of the metal member 14 is, for example, 1 µm. The diameter of the hole 13 is, for example, 2 µm.

The silicon layer 3 further includes a periphery portion 18, which is spaced apart from the movable portion 6 and the fixed portion 7. The periphery portion 18 is fixed to the substrate 1. Thus, the movable portion 6, the fixed portion 7 and the periphery portion 18 are separated from each other by the trench 5, which is formed in the silicon layer 3. A bonding wire (not shown) is formed on the periphery portion 18 so that the periphery portion 18 is electrically fixed to a ground.

Figure 3:
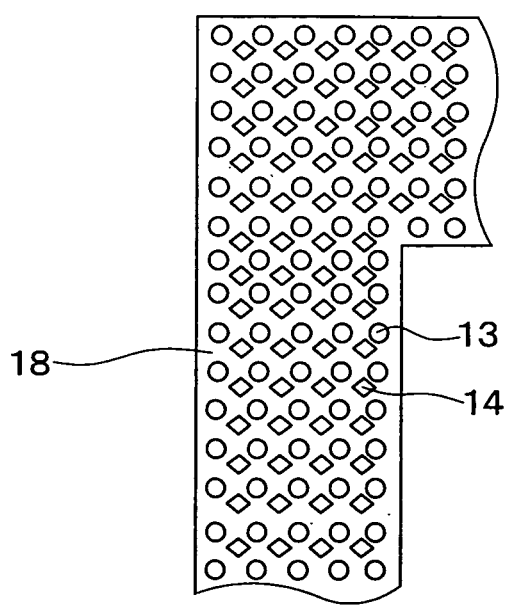
FIG. 3 is a diagram showing a plan view of a part of a periphery portion of the sensor.

FIG. 3 shows a plan view of a part of the periphery portion 18. Multiple holes 13 and multiple metal members 14 are formed on the periphery portion 18. Although FIGS. 1 and 3 partially shows the periphery portion 18, the holes 13 and the metal members 14 are formed on a whole of the periphery portion 18.

The sensor may be mounted on a vehicle in such a manner that the longitudinal direction of the weight portion 8 is in parallel to a front-rear direction of the vehicle. When a predetermined electric potential is applied to the fixed portion 7, and acceleration is applied to the sensor along with the front-rear direction of the vehicle, the capacitance between the movable electrode 10 and the fixed electrode 16 is changed. The capacitance change is retrieved from the output terminal 12 arranged on the anchor portion 11, so that the acceleration along with the front-rear direction of the vehicle is detected.

Although the number of metal members 14 in FIGS. 1 and 2 and the number of holes 13 in FIGS. 1 and 2 are specified, the number of metal members 14 and the number of holes 13 may be different from those in FIGS. 1 and 2. Further, the arrangement of the metal members 14 and the holes 13 may be different from that in FIGS. 1 and 2.

Next, a method for manufacturing the sensor will be explained as follows. FIGS. 4A to 4E show steps for forming the sensor. In FIGS. 4A to 4E, multiple sensors are formed.

Figure 4A:
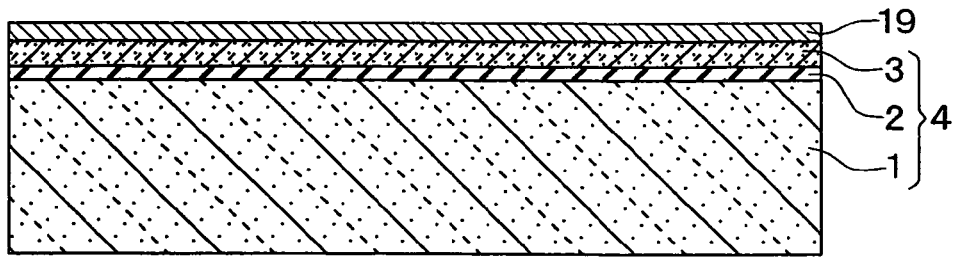
FIGS. 4A to 4E are diagram showing a manufacturing method for the sensor.

As shown in FIG. 4A, the support substrate 1 made of N conductive type silicon is prepared. The embedded oxide film 2 made of, for example, SiO$_2$ is formed on the surface of the substrate 1. A silicon substrate is bonded to the surface of the oxide film 2, and then, the surface of the silicon substrate is polished so that the thickness of the silicon substrate is reduced. Thus, the silicon layer 3 is formed, and the SOI substrate 4 is completed. The SOI substrate 4 may be formed by a different manner since there are many conventional methods for forming the SOI substrate 4.

A metal layer 19 is formed on the surface of the silicon layer 3 by a sputtering method, a vapor deposition method or the like. The metal layer 19 is made of, for example, aluminum. The metal layer 19 provides the output terminal 12 for the movable portion 6, the output terminal for the fixed portion 7 and the metal member 14. The thickness of the metal layer 19 is, for example, 1 µm.

Figure 4B:
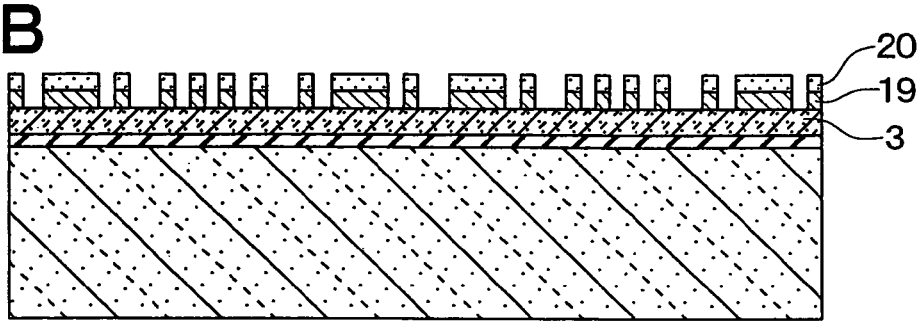
Figure 5A:
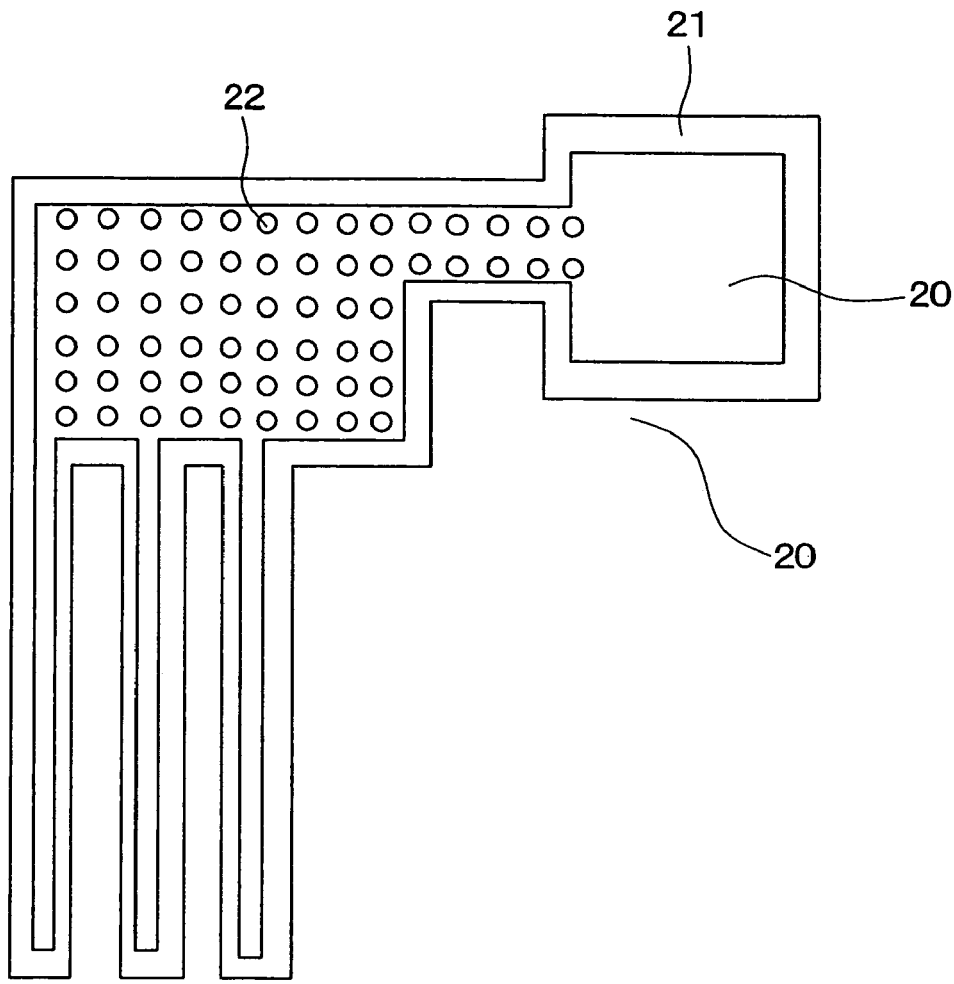
FIG. 5A is a diagram showing a photo resist having an opening for the fixed portion and a side etching hole.

As shown in FIG. 4B, a photo resist 20 is formed on the metal layer 19. Then, as shown in FIG. 5A, the resist 20 is patterned to correspond to the fixed portion 7 so that an opening 21 for the fixed portion 7 is formed in the resist 20. Further, multiple side etching holes 22 are formed in the resist 20 such that a portion of the metal layer 19 to be the output terminal 17 for the fixed portion 7 and other portions are separated from each other. The portion of the metal layer 19 to be the output terminal 17 for the fixed portion 7 and the other portions are disposed in a region surrounded with the opening 21 for the fixed portion 7. In FIG. 5A, the holes 22 and the opening 21 are formed on the surface of the resist 20.

Figure 5B:
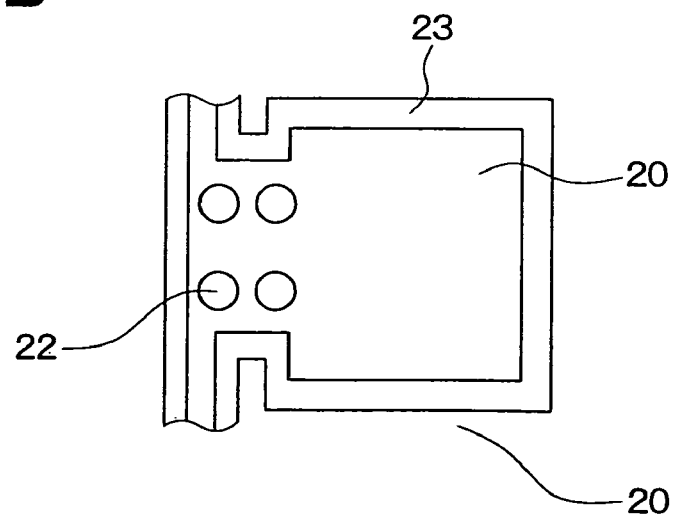
FIG. 5B is a diagram showing a photo resist having an opening for a movable portion and a side etching hole.

As shown in FIG. 5B, an opening 23 for the movable portion 6 is formed in the resist 20 so that the resist 20 is patterned to correspond to the movable portion 6. Further, multiple side etching holes 22 are formed in the resist 20 such that a portion of the metal layer 19 to be the output terminal 12 for the movable portion 6 and other portions are separated from each other. In FIG. 5B, the holes 22 and the opening 23 are formed on the surface of the resist 20.

A side etching hole (not shown) is formed in the resist 20 such that the hole is disposed in the periphery portion 18, which is arranged on the periphery of the fixed portion 7 and the movable portion 6. The side etching hole (not shown) is equivalent to the side etching holes 22 in FIGS. 5A and 5B.

A photo mask corresponding to the opening 21 for the fixed portion 7, the opening 23 for the movable portion 6 and the side etching holes 22 is used in a photo lithography process including a lithographic exposure step, a development step and a post exposure bake step.

A part of the metal layer 19 exposed via the opening 21 for the fixed portion 7, the opening 23 for the movable portion 6 and the side etching holes 22 is anisotropically etched. Thus, the part of the metal layer 19 exposed from the resist 20 via the openings 21, 23 and the holes 13 is removed so that the silicon layer 3 is exposed from the metal layer 19.

Figure 4C:
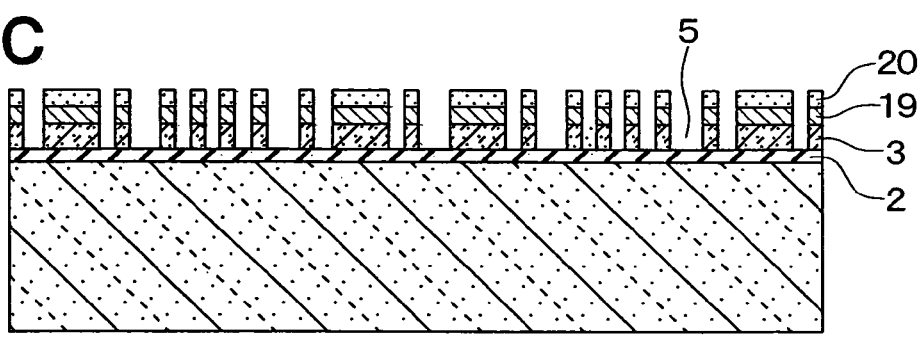

As shown in FIG. 4C, a part of the silicon layer 3 exposed via the opening 21 for the fixed portion 7 in the resist 20 is anisotropically etched with using the embedded oxide film 2 as an etching stopper so that the fixed portion 7 is formed in the silicon layer 3. Similarly, another part of the silicon layer 3 exposed via the opening 23 for the movable portion 6 in the resist 20 is anisotropically etched with using the embedded oxide film 2 as an etching stopper so that the movable 6 is formed in the silicon layer 3. Thus, the trench 5 is formed in the silicon layer 3, and the fixed portion 7, the movable portion 6 and the periphery portion 18 are separated from each other.

Figure 4D:
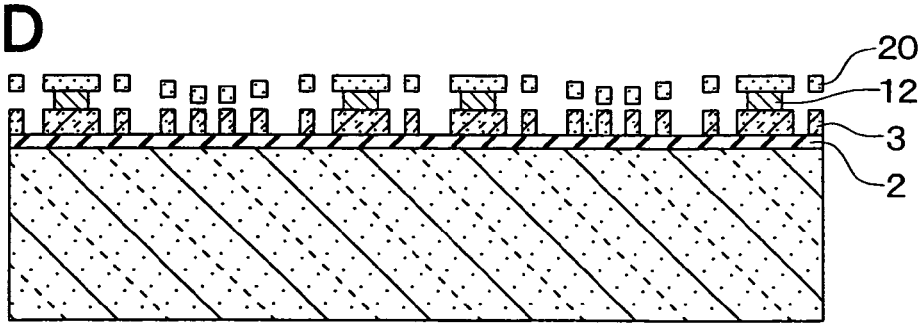

As shown in FIG. 4D, the metal layer 19 is side etched via the opening 21 for the fixed portion 7, the opening 23 for the movable portion 6 and the etching holes 13 as a starting point. The side etching step will be explained with reference to FIGS. 6A to 7B. In FIGS. 6A to 7B, the metal layer 19 is shown as a dashed diagonal line.

Figure 6A:
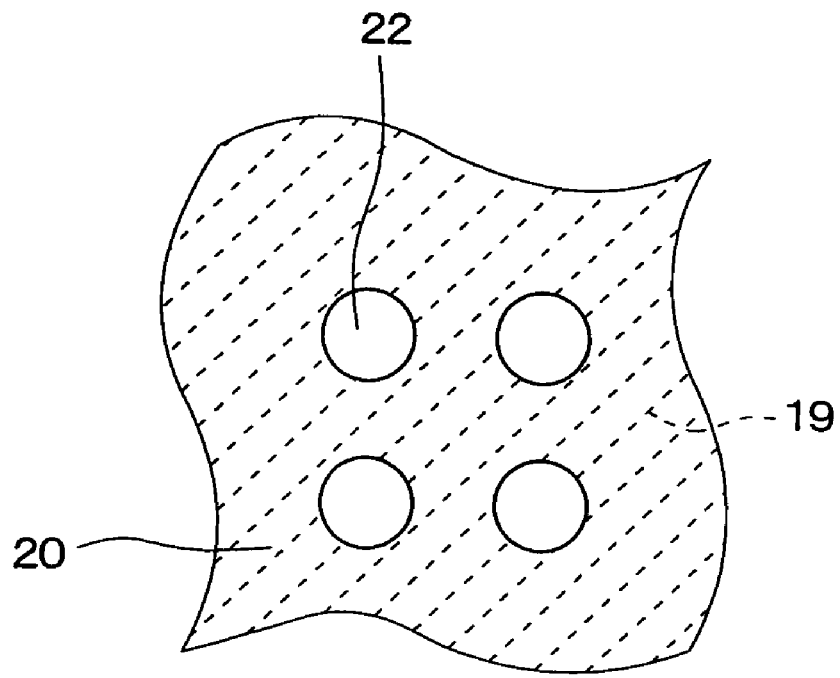
FIGS. 6A and 6B are diagrams showing side etch effect of a metallic layer when the resist includes four side etching holes.
Figure 6B:
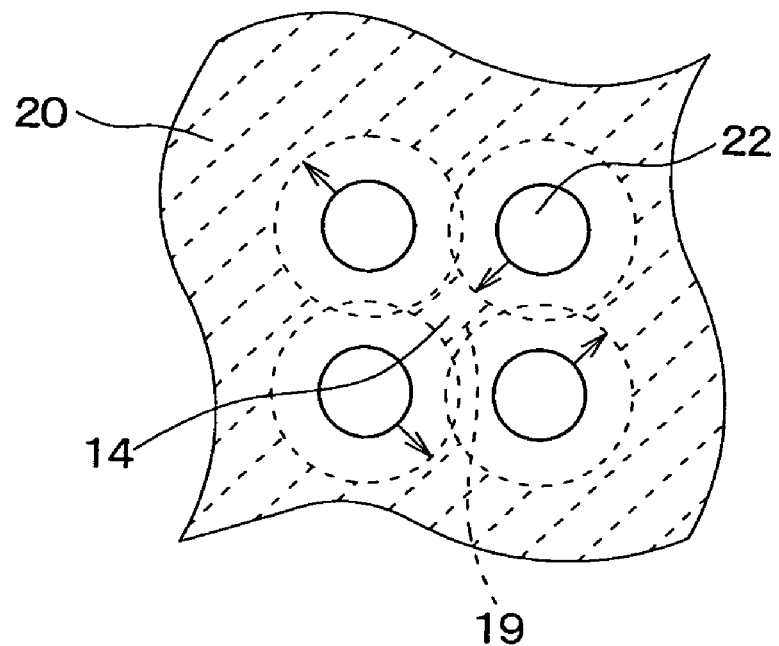

FIGS. 6A and 6B show side etching process of the metal layer 19 when the resist 20 includes four side etching holes 22. As shown in FIG. 6A, four side etching holes 22 having a circular shape are disposed at four corners of a square. The metal layer 19 under the resist 20 is side etched via the holes 22 as a starting point.

As shown in FIG. 6B, the metal layer 19 under the resist 20 is etched concentrically from the side etching hole 22 as a center. Specifically, the side etching is spread along with an arrow in FIG. 6B. The metal layer 19 disposed at the center surrounded with four holes 22 is not etched so that the metal layer 19 remains on the silicon layer 3. When the side etching holes are arranged at four corners of the square, the metal layer 19 partially remains in a rhombic manner so that the rhombic metal layer 19 provides the metal member 14. The metal member 14 is disposed under the resist 20 in FIG. 6B. Alternatively, when the side etching holes 22 are arranged at three corners of a triangle, the metal member 14 has a triangle shape.

Figure 7A:
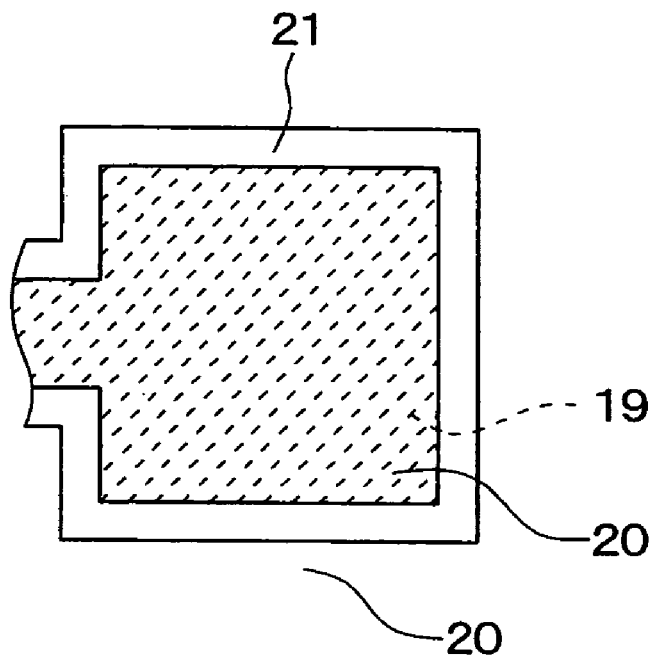
FIGS. 7A and 7b are diagrams showing side etch effect of the metallic layer from the opening for the fixed portion as a starting point.
Figure 7B:
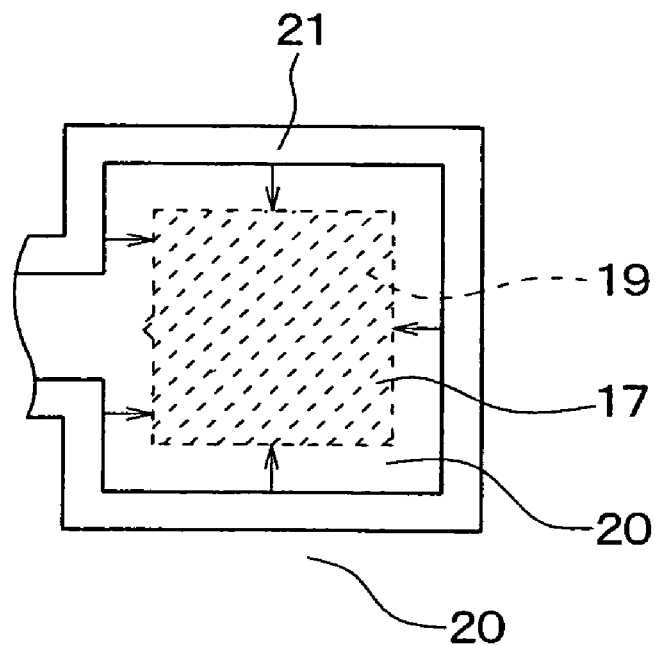

FIGS. 7A and 7B show the side etching process of the metal layer 19 via the opening 21 for the fixed portion 7 as a starting point. The metal layer 19 under the resist 20 is side etched from the opening 21, as shown in FIG. 7A. As shown in FIG. 7B, the metal layer 19 is side etched along with an arrow in FIG. 7B. Specifically, the side etching proceeds toward a region surrounded with the opening 21. Thus, the metal layer 19 is side etched with reducing an outer shape of the opening 21 in such a manner that the metal layer 19 is similar to the outer shape of the opening 21. Thus, the metal layer 19 under the resist 20 remains in a square manner. The metal layer 19 on the fixed portion 7 remains so that the metal layer 19 provides the output terminal 17 for the fixed portion 7. Thus, the metal layer 19 is side etched as shown in FIGS. 6A to 7B.

Here, the metal layer 19 on the fixed wiring 15 and the output terminal 17 for the fixed portion 7 are separated from each other so that the metal layer 19 and the output terminal 17 are electrically isolated. This isolation is performed by the side etching process, and explained with reference to FIG. 8.

Figure 8:
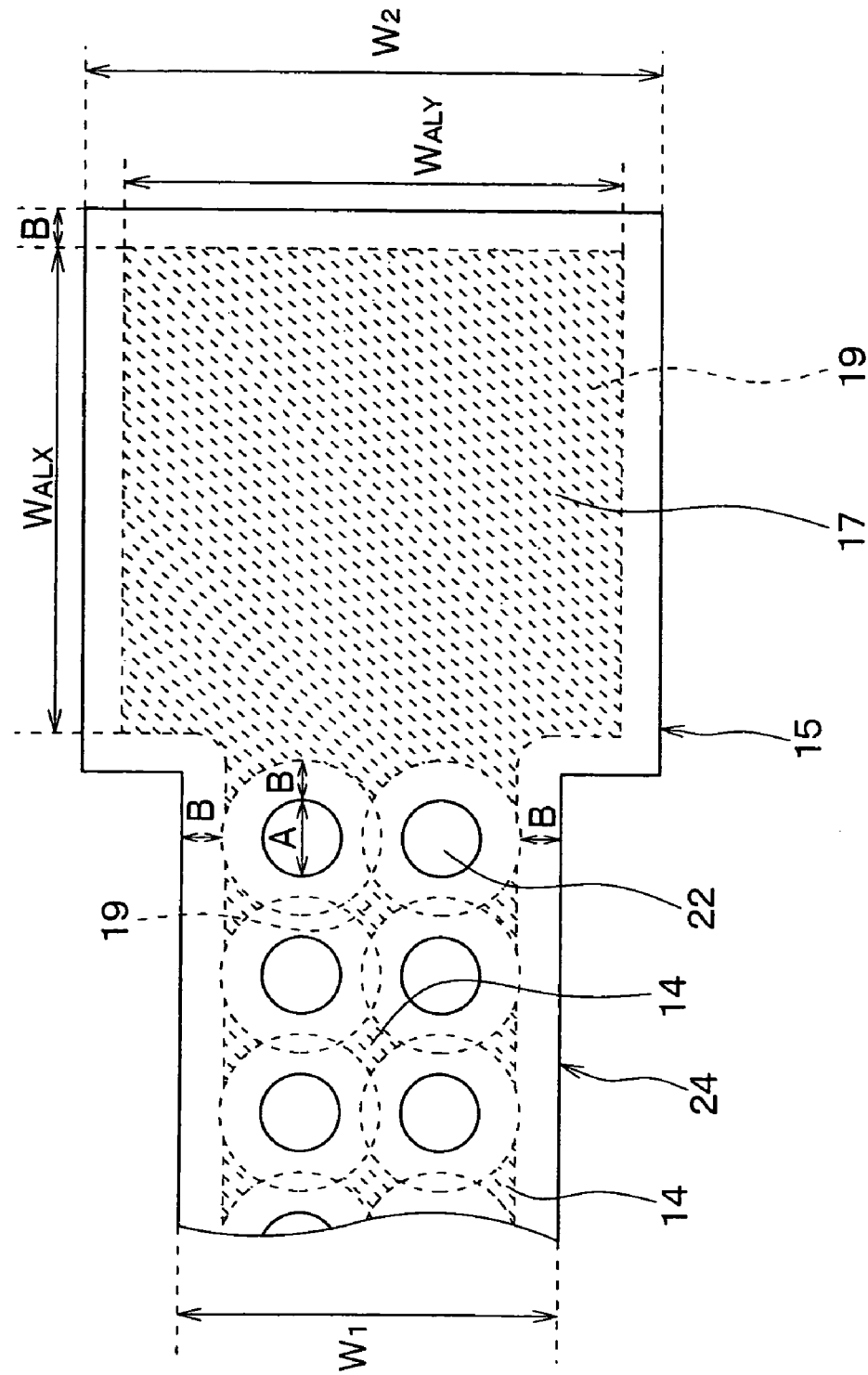
FIG. 8 is a diagram showing the resist on a portion of the metallic layer to be a fixed wiring portion, the resist having a side etching hole for providing to separate a portion of the metallic layer to be the output terminal for the fixed portion from other portions of the metallic layer.

FIG. 8 shows a side etching holes 22, which are formed in the resist 20 on a part to be the fixed wiring 15 in such a manner that a part to be the output terminal 17 for the fixed portion 7 and a part to be the metal member 14 are separated from each other. FIG. 8 shows the part to be the output terminal 17 for the fixed portion 7. The metal layer 19 under the resist 20 is shown as a dotted line.

As shown in FIG. 8, the diameter of the side etching hole 22 is defined as A, and the distance of a side etched area from the side etching hole 22 as a starting point is defined as B. The fixed wiring 15 includes a lead portion 24 for the fixed electrode 16, which extends from the part to be the output terminal 17. The lead width of the lead portion 24 is defined as W1. The fixed wiring 15 further includes a portion, on which the output terminal 17 for the fixed portion 7 is arranged. The portion of the fixed wiring 15 has a width defined as W2 along with a direction parallel to the lead width W1. The designing width of the terminal 17 along with the direction parallel to the lead width W1 is defined as $W_{ALY}$. The designing length of the terminal 17 along with a direction perpendicular to the lead width W1 is defined as $W_{ALX}$. The fixed electrode 16 has a width along with a short axis, which is defined as W3.

The number of holes 22 along with the direction parallel to the lead width W1 is defined as N. The lead width W1 satisfies the relation ship of W1<A×N+2B×(N+1). Further, the width W2 of the portion of the fixed wiring 15 satisfies the relationship of W2<$W_{ALY}$+2B. Here, when the relationship of W3≦2B is satisfied, the metal layer 19 on the fixed electrode 16 is completely removed.

For example, the diameter A of the hole 22 is 2 μm, the distance B of the side etched area is 3 μm, the lead width W1 is 25 μm, and the width W2 of the portion of the fixed wiring 15 is 126 width W2 of the portion of the fixed wiring 15. In this case, when the designing width WALX and the designing length WALY of the terminal 17 are 120 μm, respectively, and the number N of the holes 22 is three, the relationship of W1<A×N+2B×(N+1) is satisfied. Further, when the width of the fixed electrode 16 is 4 μm, the W3≦2B is satisfied so that the metal layer 19 is not remained on the fixed electrode 16.

As shown in FIG. 8, the metal layer 19 under the resist 20 is side etched from the side etching hole 22 as a starting point, so that the metal layer 19 on the lead portion 24 for the fixed electrode 16 is separated from the metal layer 19 on the part of the fixed wiring 15 as the output terminal 17 for the fixed portion 7 so that the metal layer 19 on the lead portion 24 as the metal member 14 is electrically isolated from the output terminal 17. Further, the metal layer 19 on the fixed electrode 16 is completely removed.

Thus, the metal layer 19 on the fixed wiring 15 other than the output terminal 17 is remained as the metal member 14. Further, the metal member 14 is electrically isolated from the output terminal 17.

Thus, the output terminal 17 is formed together with the metal member 14 in such a manner that the output terminal 17 is electrically isolated from the metal member 14 on the fixed wiring 15. Similarly, the output terminal 12 for the movable portion 6 is formed together with the metal member 14 in such a manner that the output terminal 12 is electrically isolated from the metal member 14 on the movable portion 6.

Other side etching holes are formed in the resist 20 on the periphery portion 18. From the holes as a starting point of side etching, the metal layer 19 on the periphery portion 18 and under the resist 20 is side etched so that a part of the metal layer 19 is remained.

Figure 4E:
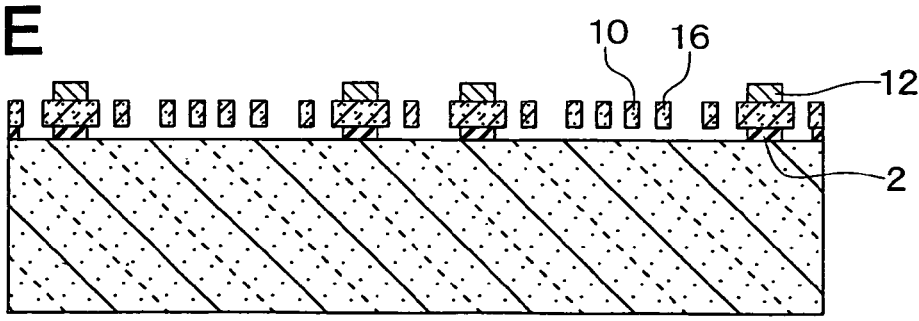

In the step shown in FIG. 4E, the resist 20 is removed. In this case, the resist 20 may be removed by a dry process such as a $O_2$ ashing method or a wet process. If necessary, the metal layer 19 may be sintered. Then, the oxide film 2 under the spring 9 of the sensing portion, the movable electrode 10 and the fixed electrode 16 is etched so that they are separated from the substrate 1. Thus, the movable portion 6 is supported with the spring 9 so that the movable portion 6 floats from the substrate 1. The acceleration sensor shown in FIG. 1 is completed.

In the embodiment, the common mask is used for forming the fixed portion 7 and the output terminal 17. Multiple side etching holes 22 are formed in the resist 20 as the common mask. The metal layer under the resist 20 is side etched from the holes 22 as a starting point, so that the output terminal 17 is formed on the fixed wiring 15, and the metal member 14 on the fixed wiring 15 is separated from the output terminal 17.

Thus, it is not necessary to use a specific mask for forming only the fixed portion 7 and a specific mask for forming only the output terminal 17. Instead, the common mask for forming both of the fixed portion 7 and the output terminal 17. Thus, the fixed portion 7 and the output terminal 17 are formed without deviating a positioning relationship between two specific masks. Thus, the manufacturing yield of the sensor is improved since reduction of manufacturing yield caused by mask position deviation is prevented. Further, since the common mask is used for forming both of the fixed portion 7 and the output terminal 17, the number of steps for manufacturing the sensor is reduced. The manufacturing cost of the sensor is also reduced.

Similar to the above method, when the output terminal 12 for the movable portion 6, the common mask is used for forming the movable portion 6 and the output terminal 12 for the movable portion 6. Thus, the movable portion 6 and the output terminal 12 are formed without deviating a positioning relationship between two specific masks.

Second Embodiment

In a second embodiment, the acceleration sensor includes a cap for covering the sensing portion.

Figure 9:
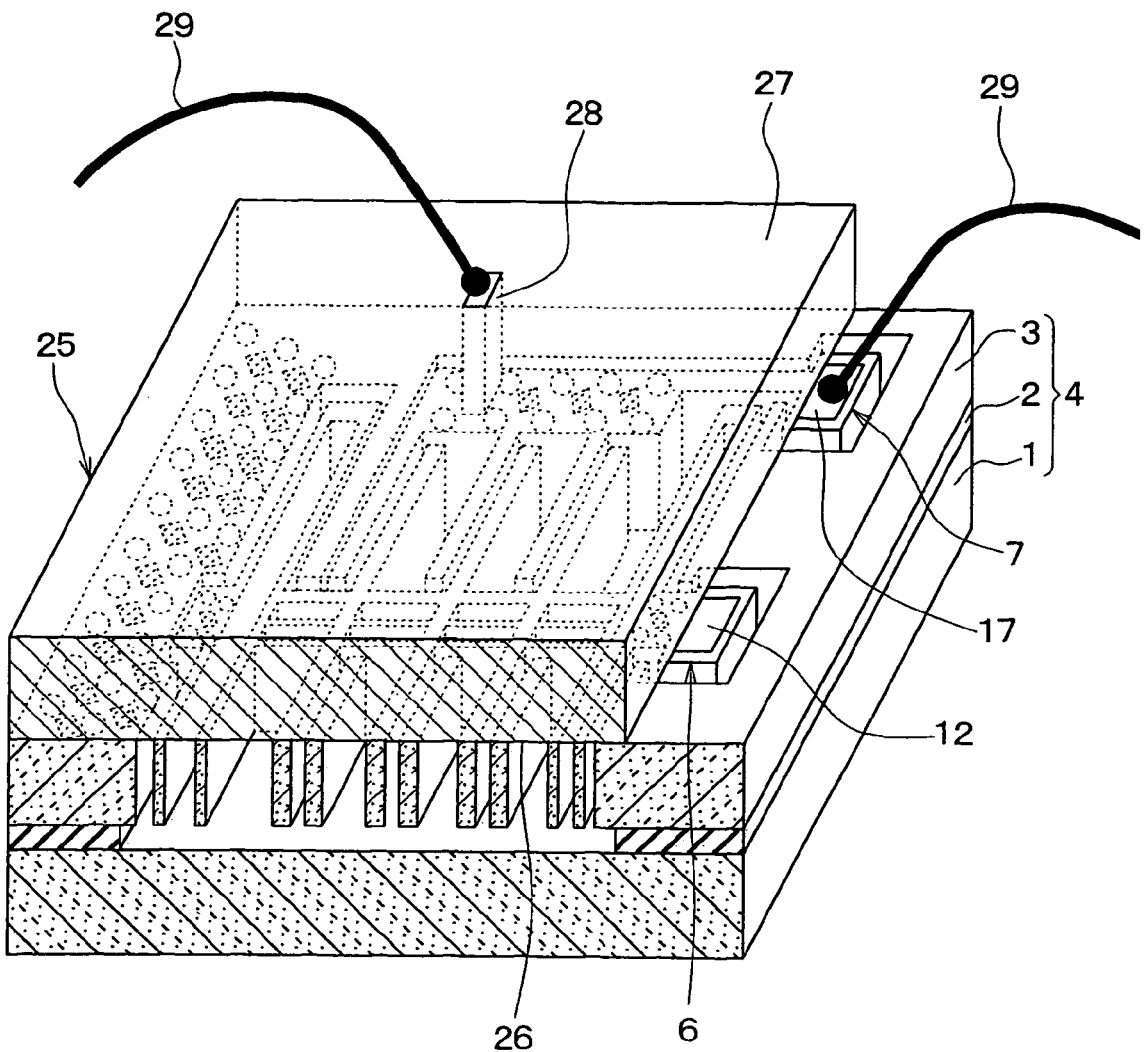
FIG. 9 is a diagram showing a perspective view of an acceleration sensor according to a second embodiment.

FIG. 9 shows the acceleration sensor according to the second embodiment. The sensor includes a cap 25 having a plate shape and disposed on the silicon layer 3. The cap 25 covers and protects the sensing portion having the movable portion 6 and the fixed portion 7 so that the movable portion 6 and the fixed portion 7 are protected from external environment. The cap 25 is made of, for example, a silicon plate or a glass plate.

The cap 25 includes a cap embedded electrode 28, which penetrates the cap 25 from one side 26 of the cap 25 facing the silicon layer 3 to an opposite side 27 of the cap 25. One end of the embedded electrode 28, which is exposed from the one side 26 of the cap 25, press-contacts the metal member 14 so that the electrode 28 is electrically coupled with the metal member 14. Further, the other end of the electrode 28, which is exposed from the other side 27 of the cap, is connected to the bonding wire 29.

The output terminal 12 for the movable portion 6 and the output terminal 17 for the fixed portion 7 are not covered with the cap 25 so that they are exposed from the cap 25. Other portions of the movable portion 6 and other portions of the fixed portion 7 are covered with the cap 25. The bonding wires 29 are connected to the terminals 12, 17 so that they are coupled with an external circuit.

The sensor is electrically coupled with the external circuit via the metal member 14 and the cap embedded electrode 28, which is disposed under the cap 25. Further, the sensor is electrically coupled with the external circuit via the output terminal 17, which is not covered with the cap 25. Thus, the sensor has multiple paths for retrieving signals from the sensor.

In FIG. 9, the sensor includes one embedded electrode 28 having a linear shape. Alternatively, the sensor may include multiple embedded electrodes 28, or an embedded electrode 28 having a bending shape in the cap 25.

The embedded electrode 28 may be connected to the metal member 14 in the periphery portion 18. For example, a wiring formed of the metal member 14 is formed in the periphery portion 18. The electrode 28 is connected to the wiring in the periphery portion 18 so that the sensor includes various wirings.

Third Embodiment

In the first and second embodiments, the metal member 14 is remained on the fixed wiring 15 and the periphery portion 18 after the metal layer 19 under the resist 20 is side etched. In a third embodiment, the metal layer 19 under the resist 20 and on the fixed wiring 15 and the periphery portion 18 is completely removed so that the metal member 14 is not formed on the fixed wiring 15 and the periphery portion 18.

Figure 10:
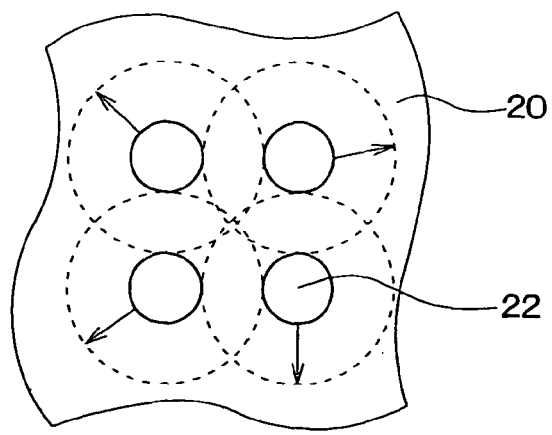
FIG. 10 is a diagram showing side etch effect of the metallic layer, which is completely etched, when the resist includes four side etching holes, according to a third embodiment.

FIG. 10 shows the side etching process of the metal layer 19 under the resist 20 when the resist 20 includes four side etching holes 22. The metal layer 19 is etched concentrically along with an arrow in FIG. 10 from the hole 22 as a starting point. The metal layer 19 arranged at a center surrounded with four holes 22 is side etched from the holes 22 so that the metal layer 19 is completely etched. In the third embodiment, almost all of the metal layer 19 other than the terminals 12, 17 is removed.

Figure 11:
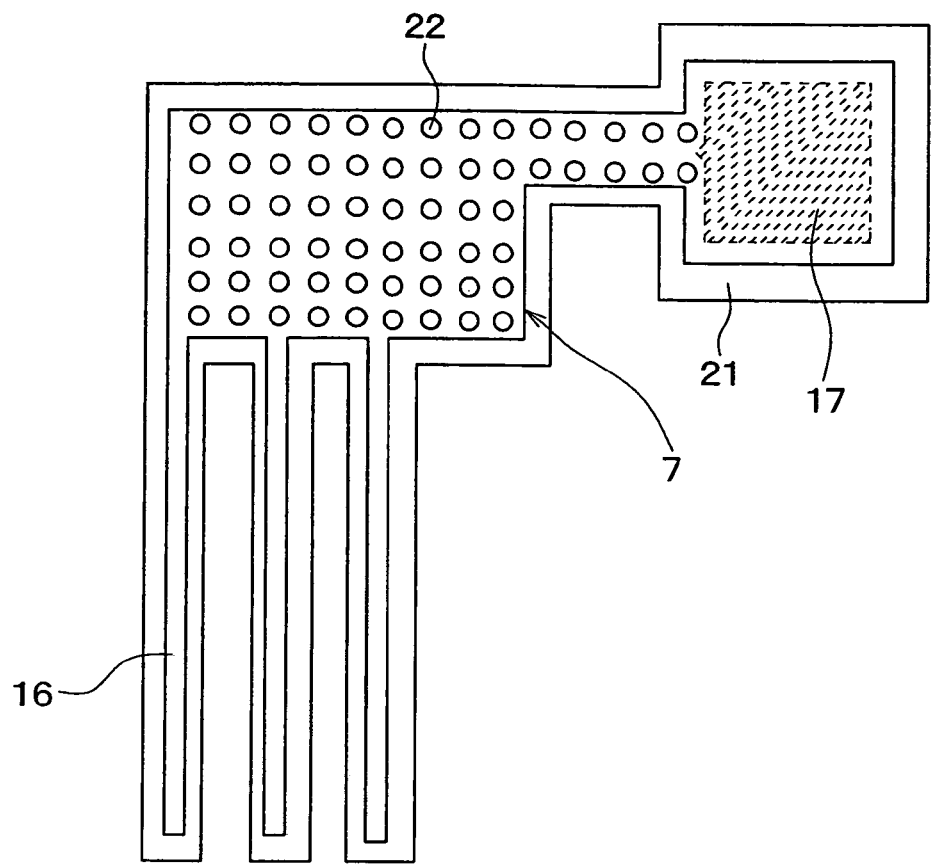
FIG. 11 is a diagram showing a plan view of the metallic layer on the fixed portion, which is etched.
Figure 12:
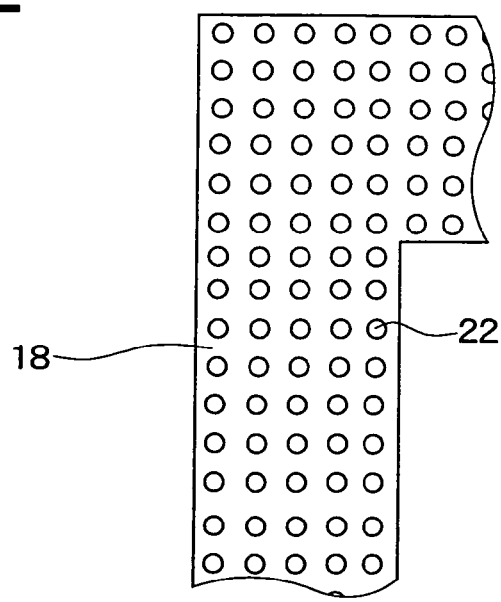
FIG. 12 is a diagram showing a plan view of the metallic layer on the periphery portion, which is completely etched.

When the metal layer 19 is side etched from the holes 22 and the opening 21 as a starting point, as shown in FIG. 11, the output terminal 17 for the fixed portion 7 is remained on the fixed wiring 15. Thus, the metal member 14 other than the output terminal 17 is removed on the fixed wiring 15. Further, the metal layer 19 on the fixed electrode 16 is completely removed. Similarly, the metal layer 19 in the periphery portion 18 is completely removed, as shown in FIG. 12 so that the metal member 14 is not formed in the periphery portion 18.

In FIG. 11, the output terminal 17 for the fixed portion 7 under the resist 20 is shown as a dotted line.

Further, the metal layer 19 other than the output terminal 12 for the movable portion 6 is completely removed from the movable portion 6.

Thus, the metal layer 19 other than the terminals 12, 17 is removed in the side etching process. When the metal member 14 remains, a difference of thermal expansion coefficient between the metal member 14 and the silicon layer 3 may generate a stress so that the stress affects performance of the sensor. In this embodiment, the metal member 14 is not formed in the sensor, so that the sensor is protected from the stress.

Other Embodiments

The shape, the dimensions, and arrangement of the side etching holes 22 in FIGS. 5 and 6 in FIGS. 5 and 6 are merely a sample of designing conditions. Thus, they may be different. For example, the hole 22 may have a square shape, a triangle shape or the like. Further, regarding the arrangement, the holes 22 may be arranged at three corners of the triangle.

In FIGS. 3, the metal member 14 is also formed in the periphery portion 18. Alternatively, the metal member 14 may not be formed in the periphery portion 18. In this case, the resist 20 includes no opening so that the resist 20 does not include the hole 13 in the periphery portion 18.

In the first embodiment, the metal layer 19 on the fixed electrode 16 is completely removed. Alternatively, the metal member 14 may be formed on the fixed electrode 16. Similarly, the metal layer 19 on the weight portion 8, the movable electrode 10 and the spring 9 is completely removed. Alternatively, the metal member 14 may be formed on the weight portion 8, the movable electrode 10 and the spring 9.

In the first embodiment, the hole 13 is formed as a concavity on the surface of the fixed wiring 15. Alternatively, the hole 13 may be a through hole penetrating the silicon layer 3 and reaching the oxide film 2, and the hole 13 is formed by an anisotropically etching method. When the dimensions of the holes in the resist 20 are very small, even when the silicon layer 3 is anisotropically etched, the hole 13 and the through hole are not formed in the silicon layer 3.

In the first embodiment, the metal layer 19 on the fixed electrode 16 is removed in the side etching process. Alternatively, the metal member 14 may be formed on the fixed electrode 16. In this case, the side etching hole 22 is formed in the resist 20 to separate the metal layer 19 on the fixed electrode 16 from the metal layer 19 on the fixed wiring 15. The metal layer 19 is side etched from the opening 21 and the hole 22 in the resist, so that the metal layer 19 on the fixed electrode 16 is electrically separated from the metal layer 19 on the fixed wiring 15. When the metal layer 19 on the fixed electrode 16 is integrally connected to the metal layer 19 on the fixed wiring 15, warpage stress is generated in the metal layer 19. Accordingly, when the metal layer 19 on the fixed electrode 16 is separated from the metal layer 19 on the fixed wiring 15, the warpage stress is not generated so that the fixed electrode 16 as the sensing portion is protected from the warpage stress.

In the first embodiment, the fixed portion 7 and the movable portion 6 are formed at the same time. Alternatively, the fixed portion 7 and the output terminal 17 for the fixed portion 7 are formed with using a common mask, and the movable portion 12 and the output terminal 12 are formed with using another common mask, so that the fixed portion 7 and the movable portion 6 are formed in different steps. In this case, the fixed portion 7 and the output terminal 17 are formed at the same time with the common mask, so that it is not necessary to form the fixed portion 7 and the output terminal 17 in multiple steps. Similarly, the movable portion 12 and the output terminal 12 are formed at the same time with using the other common mask, so that it is nit necessary to form the movable portion 12 and the output terminal 1 in multiple steps.

In the manufacturing method of the acceleration sensor, the common mask is used for forming the fixed portion 7 and the opening 21 for the fixed portion 7 and for forming the movable portion 6 and the output terminal 12 for the movable portion 6. Alternatively, a yaw rate sensor, a pressure sensor or the like may be manufactured with using a common mask for patterning the silicon layer 3 and for forming a pad on the silicon layer 3.

For example, the patterned silicon layer 3 is defined as a patterned portion. The patterned portion corresponds to the fixed portion 7 and the movable portion 6. The pad is formed on the patterned portion so that the sensor is electrically coupled with an external circuit via the pad. The pad corresponds to the output terminal 17 for the fixed portion 7 and the output terminal 12 for the movable portion 6.

When the patterned portion and the pad are formed, the silicon layer 3 is prepared. Then, the metal layer 19 is formed on the silicon layer 3. Then, the resist 20 is formed on the metal layer 19. The resist 20 is patterned to correspond to the pattered portion so that the resist 20 includes an opening for the patterned portion. Further, the side etching hole 22 is formed in the resist 20 so as to separate a portion of the metal layer 19 to be the pad from other portions of the metal layer 19. The side etching hole 22 is disposed in a region surrounded with the opening for the patterned portion. The opening for the patterned portion corresponds to the opening 21 for the fixed portion 7 and the like.

The metal layer 19 exposed via the opening for the patterned portion and the etching hole 13 is anisotropically etched. Then, the silicon layer 3 exposed via the opening for the patterned portion is anisotropically etched, so that the spattered portion is formed in the silicon layer 3.

After the patterned portion is formed, the metal layer 19 is side etched from the opening for the pattered portion and the side etching hole 22 as a starting point. Thus, the pad is formed on the patterned portion, and the metal layer 19 on the patterned portion as the metal member 14 is electrically separated from the pad. Thus, by using the common mask, the patterned portion and the pad are formed at the same time. The metal layer 19 other than the pad may be completely removed, so that only the pad on the patterned portion remains.

In the above embodiments, the metal member 14 may function as a wiring for the sensor. Further, the metal member 14 provides to facilitate adhesion between the cap 25 and the semiconductor layer 3 when the cap 25 press-contacts the semiconductor layer 3.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for manufacturing a semiconductor physical quantity sensor having a fixed portion, a movable portion and a first output terminal, wherein the fixed portion includes a fixed electrode and a fixed wiring, the movable portion includes a movable electrode facing the fixed electrode, the first output terminal is disposed on the fixed wiring, and the sensor detects a physical quantity based on a capacitance between the movable electrode and the fixed electrode, the method comprising:

forming a metal layer on a semiconductor layer;

forming a resist on the metal layer;

patterning the resist to have a first opening for the fixed portion and to have a first side etching hole, wherein the first side etching hole is arranged in a region of the resist surrounded with the first opening of the resist;

anisotropically etching the metal layer exposed via the first opening and the first side etching hole;

anisotropically etching the semiconductor layer exposed via the first opening so that the fixed portion is formed in the semiconductor layer; and side etching the metal layer from the first opening and the first side etching hole as a starting point so that the output terminal is formed on a part of the fixed wiring, and a first metal member is formed on another part of the fixed wiring in such a manner that the first metal member is electrically separated from the first output terminal.

2. The method according to claim 1, wherein the sensor further includes a second output terminal, which is disposed on the movable portion, wherein the patterning the resist includes forming a second opening for the movable portion and a second side etching hole, wherein the second side etching hole is arranged in a second region of the resist surrounded with the second opening of the resist, wherein the anisotropically etching the metal layer includes anisotropically etching the metal layer exposed via the second opening and the second side etching hole, wherein the anisotropically etching the semiconductor layer includes anisotropically etching the semiconductor layer exposed via the second opening so that the movable portion is formed in the semiconductor layer, and wherein the side etching the metal layer includes side etching the metal layer from the second opening and the second side etching hole as a starting point so that the second output terminal is formed on a part of the movable portion, a second metal member is formed on another part of the movable portion in such a manner that the second metal member is electrically separated from the second output terminal.

3. The method according to claim 1, wherein the side etching the metal layer includes remaining the metal layer on the another part of the fixed wiring, and wherein the remained metal layer other than the first output terminal provides the first metal member.

4. The method according to claim 1, wherein the patterning the resist includes forming a third opening for the fixed electrode and a third side etching hole, wherein the third side etching hole is arranged in a third region of the resist surrounded with the third opening of the resist, wherein the anisotropically etching the metal layer includes anisotropically etching the metal layer exposed via the third opening and the third side etching hole, wherein the anisotropically etching the semiconductor layer includes anisotropically etching the semiconductor layer exposed via the third opening so that the fixed electrode is formed in the semiconductor layer, and wherein the side etching the metal layer includes side etching the metal layer from the third opening and the third side etching hole as a starting point so that a third metal member is formed on the fixed electrode in such a manner that the third metal member is electrically separated from the first metal member.

5. The method according to claim 1, wherein the sensor further includes a periphery portion, which surrounds the fixed portion and the movable portion, wherein the patterning the resist includes forming a fourth opening for the periphery portion and a fourth side etching hole, wherein the fourth side etching hole is arranged in a fourth region of the resist surrounded with the fourth opening of the resist, wherein the anisotropically etching the metal layer includes anisotropically etching the metal layer exposed via the fourth opening and the fourth side etching hole, wherein the anisotropically etching the semiconductor layer includes anisotropically etching the semiconductor layer exposed via the fourth opening so that the periphery portion is formed in the semiconductor layer, and wherein the side etching the metal layer includes side etching the metal layer from the fourth opening and the fourth side etching hole as a starting point so that a fourth metal member is formed on the periphery portion.

6. The method according to claim 1, further comprising:

forming the semiconductor layer on a substrate via an insulation film; and etching the insulation film under the movable electrode after the side etching the metal layer so that the movable electrode is separated from the substrate.

7. The method according to claim 6, wherein the physical quantity sensor is one of an acceleration sensor, a yaw rate sensor and a pressure sensor.

* * * * *